United States Patent [19]

Slater et al.

[11] Patent Number: 5,258,265
[45] Date of Patent: Nov. 2, 1993

[54] AQUEOUS DEVELOPABLE DEEP UV NEGATIVE RESIST

[75] Inventors: Sydney G. Slater, New Haven; Stanley A. Ficner, Durham, both of Conn.

[73] Assignee: Olin Corporation, Cheshire, Conn.

[21] Appl. No.: 980,057

[22] Filed: Nov. 23, 1992

Related U.S. Application Data

[62] Division of Ser. No. 348,754, Apr. 24, 1989, Pat. No. 5,178,987.

[51] Int. Cl.$^5$ ................................................ G06C 5/00
[52] U.S. Cl. ..................... 430/325; 430/270; 430/271; 430/275; 430/277; 430/278; 522/52; 522/63; 522/68; 522/166
[58] Field of Search .............. 430/325, 270, 271, 275, 430/277, 278; 522/52, 63, 68, 166

[56] References Cited

U.S. PATENT DOCUMENTS

| | | | |
|---|---|---|---|
| 4,343,885 | 8/1982 | Reardon, Jr. | 430/270 |
| 4,649,100 | 3/1987 | Leyrer et al. | 430/283 |
| 4,740,450 | 4/1988 | Tamaoki et al. | 430/273 |
| 4,902,603 | 2/1990 | Slater et al. | 430/270 |

FOREIGN PATENT DOCUMENTS 61-153632 7/1986 Japan.

OTHER PUBLICATIONS

Chemical Abstract No. 108(7):55225f, by McAuley, Iain; Krogh, Erik; and Wan, Peter from the Journal of American Chemical Society, 110(2), 600-2.

Abstract No. 77(14):92787c by Takacs, Mihaly; Kertesz, Piroska; Vegh, Antal; and Simonyi, Istvan from the Acta Pharmaceutical of Hungari, 42(4), 177-82.

Chemical Abstract 106(10):76147f, Onishi et al., Photosensitive Compositions, Jul. 12, 1991.

*Primary Examiner*—Marion E. McCamish
*Assistant Examiner*—Mark A. Chapman
*Attorney, Agent, or Firm*—William A. Simons

[57] ABSTRACT

A radiation-sensitive mixture useful as a negative-working photoresist composition comprising:
(a) at least one novolak resin; and
(b) a photoactive benzannelated acetic acid selected from formula (I):

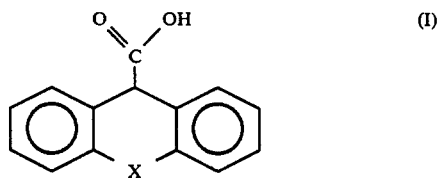

wherein X is either an oxygen, sulfur or $-C-H_2$.

6 Claims, No Drawings

AQUEOUS DEVELOPABLE DEEP UV NEGATIVE RESIST

This application is a division of application Ser. No. 07/348,754 filed Apr. 24, 1989, U.S. Pat. No. 5,178,987.

BACKGROUND OF THE INVENTION

1. Field of the Invention

The present invention relates to radiation-sensitive mixtures useful as negative-working resist compositions containing at least one novolak resin and selected benzannelated acetic acids as the photoactive compound. Furthermore, the present invention also relates to substrates coated with these radiation-sensitive mixtures as well as the process of imaging and developing these radiation-sensitive mixtures on these substrates.

2. Description of Related Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to fix the coating onto the substrate. The baked coated surface of the substrate is next subjected to an image-wise exposure of radiation. This radiation exposure causes a chemical transformation in the exposed areas of the coated surface. Ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions—negative-working and positive-working. When negative-working photoresist compositions are exposed image-wise to radiation, the areas of the resist composition exposed to the radiation become more insoluble to a developer solution (e.g. a cross-linking reaction occurs) while the unexposed areas of the photoresist coating remain relatively soluble to a developing solution. Thus, treatment of an exposed negative-working resist with a developer causes removal of the non-exposed areas of the resist coating and the creation of a negative image in the photoresist coating. On the other hand, when positive-working photoresist compositions are exposed image-wise to radiation, those areas of the resist composition exposed to the radiation become more soluble to the developer solution (e.g. a decomposition reaction occurs) while those areas not exposed remain relatively insoluble to the developer solution. Thus, treatment of an exposed positive-working resist with the developer causes removal of the exposed areas of the resist coating and the creation of a positive image in the photoresist coating.

After this development operation, the now partially unprotected substrate may be treated with a substrate-etchant solution or plasma gas mixture and the like. The etchant solution or plasma gas mixture etches the portion of the substrate where the photoresist coating was removed during development. The areas of the substrate where a positive photoresist coating still remains are protected and, thus, an etched pattern is created in the substrate material which corresponds to the photomask used for the image-wise exposure of the radiation. Later, the remaining areas of the positive photoresist coating may be removed during a stripping operation, leaving a clean etched substrate surface.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less is necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Still further, many current negative photoresist formulations also swell when subjected to development steps, thereby causing image distortion. And, negative photoresists generally require an organic developer solution. The employment of such organic materials creates special handling and disposal problems for the photoresist fabricator.

On the other hand, positive photoresist formulations are not favored for all commercial applications. For example, positive photoresists such as those based on novolak resins and orthonaphthoquinone diazide photosensitizers have certain processing limitations when their imaging is carried out in the deep ultraviolet region of the light spectrum. In this class of positive resists, both ingredients absorb light from the deep ultraviolet region and, thus, the photoresist requires increased input of radiation to compensate for the unwanted light absorptions.

Accordingly, there is a need for a better negative-working photoresist formulation which overcomes the deficiencies of current negative-working photoresists, especially in the area of the deep UV light region where positive-working resists have limitations as to commercialization. The present invention is believed to be an answer to that need.

SUMMARY OF THE INVENTION

Accordingly, the present invention is directed to a radiation-sensitive mixture useful as a negative-working photoresist composition comprising the admixture of:
(a) at least one novolak-type resin; and
(b) a photoactive benzannelated acetic acid selected from the compounds of formula (I):

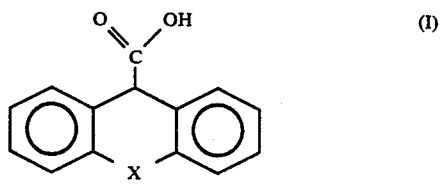

wherein X is either an oxygen, sulfur or —C—H$_2$.

Moreover, the present invention also encompasses the process of coating substrates with these radiation-sensitive mixtures and then imaging and developing these coated substrates.

Still further, the present invention also encompasses said coated substrates (both before and after imaging) as novel articles of manufacture.

DETAILED DESCRIPTION

The preferred photoactive (also called "sensitizer") benzannelated acetic acid is xanthene-9-carboxylic acid. This compound is also known as 9H-xanthene-9-carboxylic acid, xanthenecarboxylic acid, or xanthanoic acid and it's Chemical Abstracts Registry Number is 82-07-5. Its structure is shown by Formula II:

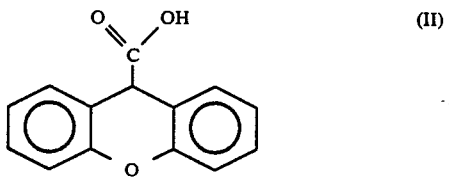

Its sulfur analog is known as thioxanthene-9-carboxylic acid or 9H-thioxanthene-9-carboxylic acid and its Chemical Abstract Registry Number is 17394-14-8.

The photoactive benzannelated acetic acid is then combined with a novolak resin or resins to make radiation-sensitive mixtures useful as negative-working photoresist compositions. The term "novolak-type resin" is used herein to mean any novolak resin which is conventionally used in photoresist compositions. Suitable novolak resins include phenol-formaldehyde novolak resins and cresol-formaldehyde novolak resins, preferably having a molecular weight of about 500 to about 30,000, more preferably from about 1,000 to about 20,000. These novolak resins are preferably prepared by the condensation reaction of phenol or cresol with formaldehyde and are characterized by being light-stable, water-insoluble, alkali-soluble and film-forming. The preparation of examples of such suitable resins is disclosed in U.S. Pat. Nos. 4,377,631; 4,529,682; and 4,587,196, all of which issued to Medhat Toukhy and are incorporated herein by reference in their entireties.

The proportion of the above sensitizer compound in the radiation-sensitive mixture may preferably range from about 1 to about 30 percent, more preferably from about 5 to about 25 percent by weight of the non-volatile (e.g. non-solvent) content of the radiation-sensitive mixture. The proportion of novolak resin in the radiation-sensitive mixture may preferably range from about 70 to about 99 percent, more preferably, from about 75 to 95 percent of the non-volatile (e.g. excluding solvents) content of the radiation-sensitive mixture.

These radiation-sensitive mixtures may also contain conventional photoresist composition ingredients such as solvents, actinic and contrast dyes, anti-striation agents, plasticizers, speed enhancers, and the like. These additional ingredients may be added to the novolak resin and sensitizer solution before the solution is coated onto the substrate.

The resins and sensitizers may be dissolved in a solvent or solvents to facilitate their application to the substrate. Examples of suitable solvents include ethyl cellosolve acetate, n-butyl acetate, xylene, ethyl lactate, propylene glycol alkyl ether acetates, or mixtures thereof and the like. The preferred amount of solvent may be from about 50% to about 500% by weight, more preferably, from about 100% to about 400%, based on combined resin and sensitizer weight.

Actinic dyes help provide increased resolution by inhibiting back scattering of light off the substrate. This back scattering causes the undesirable effect of optical notching, especially where the substrate is highly reflective or has topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to ten percent weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555) and Calco Red A (C.I. No. 26125) up to ten percent weight levels, based on the combined weight of resin and sensitizer.

Anti-striation agents level out the photoresist coating or film to a uniform thickness. This is important to ensure uniform radiation exposure over the film surface. Anti-striation agents may be used up to five percent weight levels, based on the combined weight of resin and sensitizer. One suitable class of anti-striation agents is non-ionic silicon-modified polymers. Non-ionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(β-chloroethyl)-ester; stearic acid; dicamphor; polypropylene; acetal resins; phenoxy resins; and alkyl resins up to ten percent weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e. in negative resists while the unexposed areas of the photoresist coating will be dissolved more quickly by the developer, the speed enhancers will also cause a larger loss of photoresist coating from the exposed areas. Speed enhancers that may be used include, for example, picric acid, nicotinic acid or nitrocinnamic acid at weight levels of up to 20 percent, based on the combined weight of resin and sensitizer.

The prepared radiation-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 115° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stencils, templates, and the like. Any conventional imaging process or apparatus currently used in processing photoresist-coated substrates may be employed with the present invention.

The exposed resist-coated substrates are next developed in alkaline inorganic or organic developing solution. Immersion development is preferred. This solution is preferably agitated, for example, by nitrogen gas agitation during immersion. Examples of alkaline inorganic developers include aqueous solutions of tetramethylammonium hydroxide, sodium hydroxide, potassium hydroxide, choline, sodium phosphates, sodium carbonate, sodium metasilicate, and the like. Examples of organic developers include isopropanol alone or mixed with methyl isobutylketone or mixtures of methyl ethyl ketone, ethanol and isopropanol and the like. The preferred developers for this invention are aqueous solutions of tetramethylammonium hydroxide.

Alternative development techniques such as spray development or puddle development, or combinations thereof, may also be used.

The substrates are allowed to remain in the developer until all of the resist coating has dissolved from the unexposed areas. Normally, development times from about 30 seconds to about 3 minutes are employed.

After selective dissolution of the coated wafers in the developing solution, they are preferably subjected to a deionized water rinse to fully remove any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the oven baking of the coating and substrate below the coating's softening point.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Preparation of Photoresist Formulation 3.52 grams of Xanthene-9-carboxylic acid were mixed with a solution comprising 15.00 grams mixed 45% m- and 55% p-cresol formaldehyde novolac resin (weight average M.W. of about 4929) and 51.84 grams of ethyl lactate. The bottle was then rolled for 12 hours at room temperature until all the solids were dissolved. The resulting resist solution was then filtered through a 0.2 micron pore size filter using a Millipore microfiltration system (a 100 ml. barrel and a 47 mm. disk were used). The filtration was conducted in a nitrogen atmosphere under a gauge pressure of 10 pounds per square inch.

EXAMPLE 2

Coating of Photoresist Composition onto a Silicon Wafer

Approximately three mls. of the filtered resist composition in Example 1 was spin-coated with a Model 5110-C single head spinner manufactured by Solitec, Inc. (Santa Clara, Calif.) onto a thermally grown silicon/silicon dioxide-coated wafer of four inches in diameter and having 5400 Angstroms of silicon dioxide on its upper surface, which was primed with 20% by volume hexamethyldisilazane (HMDS)/80% by volume xylene solution. The resist was applied to a static wafer. Then, the wafer was rotated to an initial spinning velocity of 500 revolutions per minute for 3 seconds, followed by acceleration at 2,000 revolutions per second to a final spinning velocity of 1,500 revolutions per minute for 30 seconds. This spinning operation evenly spread the photoresist over the upper surface of the wafer to produce an even thin film. The coated wafer was then subsequently baked at 100° C. on a vacuum applied hot plate for 60 seconds. The photoresist film thickness was then measured to be approximately one micron with a Dektak IIa profilometer unit manufactured by Sloan Technology (Santa Barbara, Calif.).

EXAMPLE 3

Deep-UV Image-Wise Exposure of 100° C. Baked Coated Wafer

The wafer baked at 100° C. in Example 2 was image-wise exposed to deep-UV light wavelengths between 220-250 nm using a Canon Model PLA-501F aligner (Lake Success, N.Y.) equipped with a Xenon-mercury UV lamp and CM250 cold mirror for a twenty five second exposure time in the hard contact mode. The deep-UV wavelengths were passed through a quartz Series 1 multidensity resolution target from Detric Optics, Inc. (Hudson, Mass.). Eight-tenths of a micron features were confirmed on the target using scanning electron microscopy. The intensity at the wafer plane was measured to be 8.62 mW/cm$^2$ with a Mimir Instruments Inc. (Santa Clara, Calif.) Model 100 Powermeter equipped with a detector for measurement at 254 nm.

EXAMPLE 4

Development of Exposed Resist Coated Wafer

The resist coated wafer exposed according to Example III was then held with Teflon tweezers and immersed in a 500 milliliter polypropylene container containing 25% by volume WAYCOAT Positive MIF Developer solution (Olin Hunt Specialty Products, Inc., West Paterson, N.J.) in water. This WAYCOAT solution is an aqueous solution of tetramethylammonium hydroxide. The wafer was allowed to remain immersed in the developer solution while the container was moved in a circular motion for fifty five seconds. Then the wafer was rinsed in deionized water for one minute and dried in a stream of filtered nitrogen. The unexposed areas of the photoresist film were developed therefore producing a negative image.

The developed and exposed wafer was then examined to determine the photospeed of the photoresist film and small feature sizes.

Photospeed of the resist was determined by looking at each of the developed areas of the resist coating corresponding to different percent transmittance windows of the SERIES I target. Photospeed of this resist was calculated by multiplying the exposure energy at the wafer plane (8.62 milliwatts per square centimeter), the lowest percent transmittance window of the target at which the resist fully coated, and the full transmittance time (twenty five seconds) and then dividing by 100.

Examination of fine features was done using a Nikon optical microscope with one thousand times magnification.

The first panel to be fully coated was the 25.1% window corresponding to a photospeed of 54.1 millijoules per centimeter squared at 254 nm. The optical microscope revealed eight-tenths micron lines.

The measured photospeed and fine feature size indicates this photoresist formulation which was baked at 100° C. and imaged in the Deep-UV range should provide excellent resolution and, thus, appears suitable for commercial applications where these baking temperatures are employed.

What is claimed is:

1. The process of developing an image-wise exposed photoresist-coated substrate comprising:
   (1) coating said substrate with a radiation-sensitive composition useful as a negative-working photoresist, said composition comprising:
      (a) at least one novolak resin; and
      (b) a photoactive benzannelated acetic acid selected from formula (I):

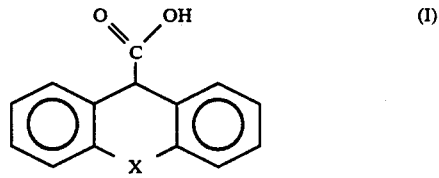

wherein X is either an oxygen, sulfur or —C—H$_2$;
   (2) subjecting said coating on said substrate to an image-wise exposure of radiant light energy; and
   (3) subjecting said image-wise exposed coated substrate to a developing solution wherein the unexposed areas of said light-exposed coating are dissolved and removed from the substrate leaving a negative image-wise pattern in the coating.

2. The process of claim 1 wherein said radiant light energy is ultraviolet light.

3. The process of claim 1 wherein said developing solution is an aqueous solution of tetramethylammonium hydroxide.

4. The process of claim 1 wherein said novolak resin is selected from the group consisting of phenolformaldehyde novolak resins and cresol-formaldehyde novolak resins.

5. The process of claim 1 wherein said (a) is from about 70 to about 90% by weight and (b) is from about 30 to about 1% by weight of the nonvolatile content of said mixture.

6. The process of claim 1 wherein said benzannelated acetic acid is xanthene-9-carboxylic acid.

* * * * *